(12) United States Patent
Soejima et al.

(10) Patent No.: US 6,625,883 B2
(45) Date of Patent: Sep. 30, 2003

(54) METHOD FOR MAKING A BUMP STRUCTURE

(75) Inventors: Koji Soejima, Tokyo (JP); Naoji Senba, Tokyo (JP)

(73) Assignee: NEC Corporation, Tokyo (JP)

( * ) Notice: Subject to any disclaimer, the term of this patent is extended or adjusted under 35 U.S.C. 154(b) by 64 days.

(21) Appl. No.: 09/837,423

(22) Filed: Apr. 19, 2001

(65) Prior Publication Data

US 2002/0038509 A1 Apr. 4, 2002

Related U.S. Application Data

(62) Division of application No. 09/188,203, filed on Nov. 9, 1998, now Pat. No. 6,307,159.

(30) Foreign Application Priority Data

Nov. 7, 1997 (JP) .............................. 9-305334

(51) Int. Cl.⁷ ................................. H01R 9/00
(52) U.S. Cl. ......................... 29/843; 29/842; 29/843; 29/848; 29/856
(58) Field of Search .................. 29/831, 846, 840, 29/843, 874, 876, 848, 856; 228/179.1, 180.21, 180.22, 250

(56) References Cited

U.S. PATENT DOCUMENTS

| | | | |
|---|---|---|---|
| 4,566,186 A | * | 1/1986 | Bauer et al. ................. 29/852 |
| 5,049,085 A | | 9/1991 | Reylek et al. |
| 5,072,520 A | * | 12/1991 | Nelson ........................ 29/852 |
| 5,362,241 A | | 11/1994 | Matsuoka et al. |
| 5,747,358 A | * | 5/1998 | Gorrell et al. ................ 216/11 |
| 5,767,010 A | * | 6/1998 | Mis et al. .................... 438/614 |
| 5,786,270 A | * | 7/1998 | Gorrell et al. ............. 438/613 |
| 5,971,253 A | | 10/1999 | Gilleo et al. |
| 6,007,349 A | | 12/1999 | Distefno et al. |
| 6,042,387 A | | 3/2000 | Jonaidi |

FOREIGN PATENT DOCUMENTS

| | | |
|---|---|---|
| JP | 198238 | 4/1989 |
| JP | 3196652 | 8/1991 |
| JP | 4137630 | 5/1992 |
| JP | 7167912 | 7/1995 |
| JP | 850146 | 2/1996 |
| JP | 10163211 | 6/1998 |

* cited by examiner

Primary Examiner—Carl J. Arbes
Assistant Examiner—Tai V Nguyen
(74) Attorney, Agent, or Firm—Young & Thompson

(57) ABSTRACT

Disclosed is a bump structure, which has a hollow body, for electrically connecting a first member and a second member. Also disclosed is a method for making a bump structure, which has the steps of: preparing a molding plate with a concave mold to mold a bump-forming member; forming a conductive thin film so as to form a predetermined cavity in the concave mold of the molding plate; preparing a substrate to which the conductive thin film is to be transferred; and transferring the conductive thin film formed on the molding plate to the substrate.

12 Claims, 18 Drawing Sheets

FIG. 6
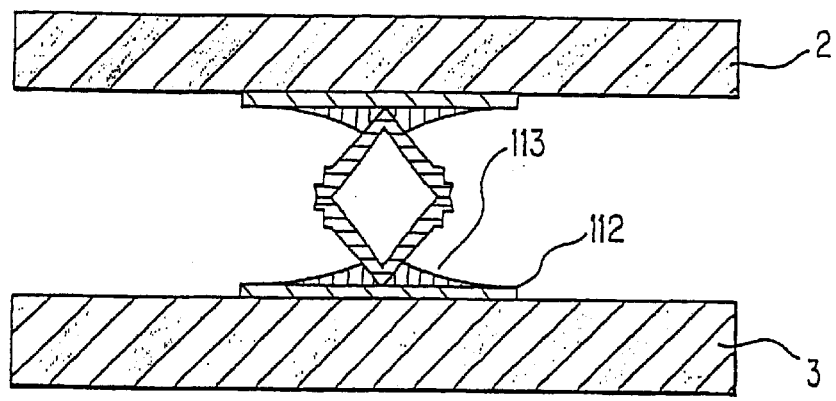
FIG. 7A
FIG. 7C
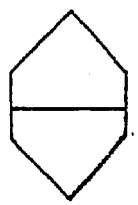
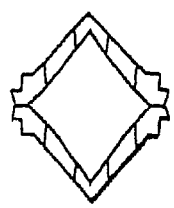
FIG. 7B
FIG. 7D
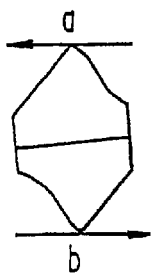
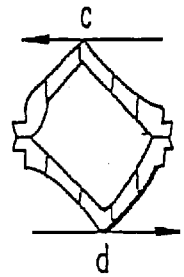
FIG. 7E
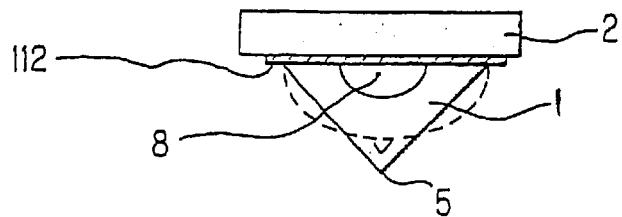

METHOD FOR MAKING A BUMP STRUCTURE

This application is a division of co-pending application Ser. No. 09/188,203, U.S. Pat. No. 6,307,159 filed on Nov. 9, 1998, the entire contents of which are hereby incorporated by reference.

FIELD OF THE INVENTION

This invention relates to a bump structure, and more particularly to, a bump structure for connecting mutually, e.g., electrodes or terminals that are formed and disposed on different electronic parts, and further relates to a method for making such a bump structure.

BACKGROUND OF THE INVENTION

Conventionally, such a bump structure has been used to connect with electrodes for IC inspection, for example, as disclosed in Japanese patent application laid-open No. 8-50146 (1996). The bump structure of Japanese patent application laid-open No. 8-50146 is, as shown in FIG. 1, made by etching a substrate to form a cantilever, forming single-crystal silicon with a pointed shape on the cantilever by anisotropic-etching, forming metal film on the surface to form a probe.

Also, Japanese patent application laid-open No. 1-98238 (1989) discloses a method for forming a connection structure with electrode by using a transfer technique. Namely, this known method is, as shown in FIG. 3, conducted by forming Ti film 5 and Pt film 6 on a bump structure forming substrate 4, coating resist film 7 thereon, forming Au bump structure 3 on the substrate by plating. Then, after removing the resist film 7, as shown in FIG. 2, the Au bump structure 3 is transferred, while aligning the Au bump structure 3 on the bump structure forming substrate 4, to the Al electrodes 2 of a semiconductor element 1 by thermo-compression bonding.

Further, Japanese patent application laid-open No. 7-167912 (1995) discloses an inspecting device using an anisotropic conductive film to electrically connect with electrodes of IC etc. This inspecting device is provided with a bump structure, which is formed by making a hole in an organic resin film and filling the hole with metal, to be connected with the electrode or terminal of an inspected electronic piece.

However, there are several problems in the above conventional techniques. The first problem is that it is necessary to use a substrate with a specific structure to make the bump structure shown in Japanese patent application laid-open No. 8-50146. Therefore, a conventionally-used substrate such as a printed-circuit board, which has been generally in wide use, cannot be used. This is because it is necessary to make concave portions at specific positions to get the flexibility of probe. Namely, in the printed-circuit board generally used, such concave portions cannot be made. Thus, only a substrate of silicon can be used to make the bump structure shown in Japanese patent application laid-open No. 8-50146.

The second problem is that the height of bump structure has to be reduced when using the method for forming a bump structure shown in Japanese patent application laid-open No. 1-98238. This is because the resist becomes difficult to form when the pitch to form the bump structure is decreased. Namely, when decreasing the pitch to form the bump structure to increase the height, the resist film with a thickness corresponding to the height of the bump structure has to be formed and an aperture to decide the form of bump structure has to be formed through the resist film. However, the shape of the aperture is difficult to control as the thickness of the resist film increases.

Further, the third problem is that the bump structure cannot have such a pointed tip that can be used as a probe contact when using the method for forming a bump structure shown in Japanese patent application laid-open No. 1-98238. This is because the tip of the transferred bump structure in this method must be flat because the bump structure is formed on the planar substrate.

The fourth problem is that the bump structure may not be formed on an arbitrary electrode when using the method for forming a bump structure shown in Japanese patent application laid-open No. 8-50146. This is because it is difficult to form the mono-crystal silicon when the flatness of an electrode where the mono-crystal silicon is to be formed is not good. A further reason is that reagents such as alkali and hydrofluoric acid may damage the surface of substrate where the bump structure is to be formed when etching silicon or silicon dioxide film.

The fifth problem is that the method for forming a bump structure shown in Japanese patent application laid-open No. 8-50146 costs more. This is because the bump structure can be made only once from silicon for forming the bump structure.

The sixth problem is that it is difficult to make a probe to inspect IC or LSI with lattice-like electrodes by using the method for forming a bump structure shown in Japanese patent application laid-open No. 8-50146. That reason is as follows: The electrode interval of IC with the lattice-like electrodes is about 250 $\mu$m. IC of 10 mm×10 mm has electrodes of more than 1000, and IC of 15 mm×15 mm more than 3000. When extracting two-dimensionally this number of electrodes, it is necessary to extract 50 wirings per 1 mm. This is equal to a wiring width pitch of 20 $\mu$m. The wiring width pitch will be further reduced when considering that electrodes or etched concavity exists on the edge as well. Therefore, it becomes difficult to extract the wiring from a probe to the outside.

The seventh problem is that the reliability of connection state is reduced when the bump structure, whose inside is filled with metal, shown in Japanese patent application laid-open No. 1-98238 is used to connect substrates with different thermal expansion coefficients. This is because, when the bump structure is disposed between two substrates with different thermal expansion coefficients to connect them, the bump structure does not transform because the entire bump structure is of metal. As a result, a large stress can be applied to the connecting interface between the substrate and the bump structure, thereby causing the separation or split.

The eighth problem is that the substrate for forming bump structure can be repeatedly used only a few times in the method for forming a bump structure shown in Japanese patent application laid-open No. 1-98238. This is because there is no repairing method when the Pt film is injured in the process of making the bump structure.

SUMMARY OF THE INVENTION

Accordingly, it is an object of the invention to provide a bump structure by which the electrical connection between electrodes or terminals of an electronic part such as IC and corresponding electrodes or terminals of a proper substrate or another electronic part can be efficiently, precisely and stably conducted.

It is a further object of the invention to provide a method for making a bump structure where such a bump structure can be efficiently and inexpensively made.

According to the invention, a bump structure for electrically connecting a first member and a second member, comprises:

a hollow body.

According to another aspect of the invention, a method for making a bump structure, comprises the steps of:

preparing a molding plate with a concave mold to mold a bump-forming member;

forming a conductive thin film so as to form a predetermined cavity in the concave mold of the molding plate;

preparing a substrate to which the conductive thin film is to be transferred; and transferring the conductive thin film formed on the molding plate to the substrate.

According to another aspect of the invention, a method for making a bump structure, comprises the steps of:

preparing at least two molding plates with a concave mold to mold a bump-forming member;

forming a conductive thin film so as to form a predetermined cavity in the concave mold of each of the molding plates;

bonding bump-forming members made of the conductive thin film formed on each of the molding plates while keeping the outermost ends of the bump-forming members opposite to each other; and separating the bump-forming member made of the conductive thin film formed on one molding plate from the one molding plate, and transferring the separated bump-forming member to the bump-forming member formed on another molding plate.

According to another aspect of the invention, a method for making a bump structure, comprises the steps of:

preparing at least two molding plates with a concave mold to mold a bump-forming member;

forming a conductive thin film so as to form a predetermined cavity in the concave mold of each of the molding plates;

bonding bump-forming members made of the conductive thin film formed on each of the molding plates while superposing the bump-forming members in a same direction; and separating the bump-forming member made of the conductive thin film formed on one molding plate from the one molding plate, and transferring the separated bump-forming member to the bump-forming member formed on another molding plate.

BRIEF DESCRIPTION OF THE DRAWINGS

The invention will be explained in more detail in conjunction with the appended drawings, wherein:

FIG. 6 is a cross sectional view showing a way to use the bump structure in FIG. 5, FIGS. 7A to 7E are illustrations showing the strain absorption effect of a bump structure of the invention.

DESCRIPTION OF THE PREFERRED EMBODIMENTS

Figure 1:
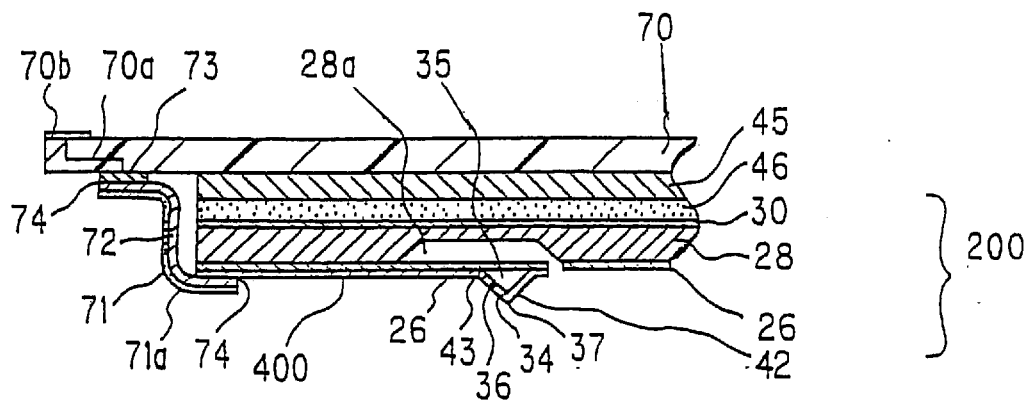
FIG. 1 is a cross sectional view showing a conventional probe card.
Figure 2:
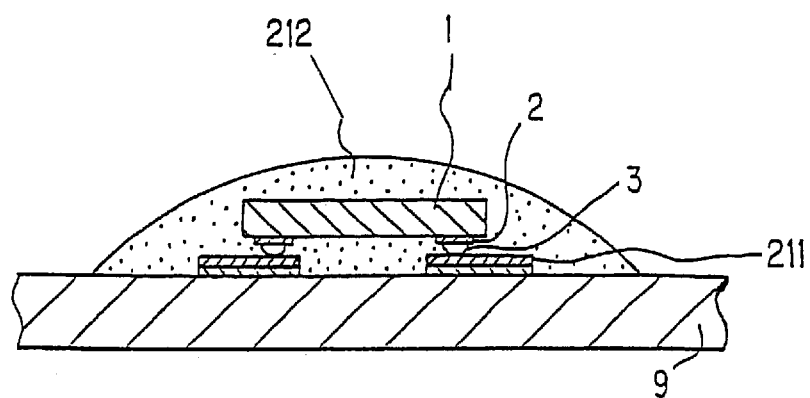
FIG. 2 is a cross sectional view showing a conventional bump structure.
Figure 3:
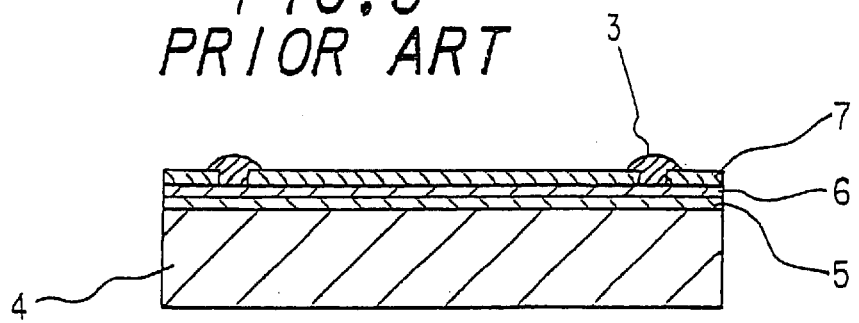
FIG. 3 is a cross sectional view showing a conventional bump structure.

A bump structure and a method for making a bump structure in the preferred embodiment according to the invention will be explained below, referring to the drawings.

Figure 4A:
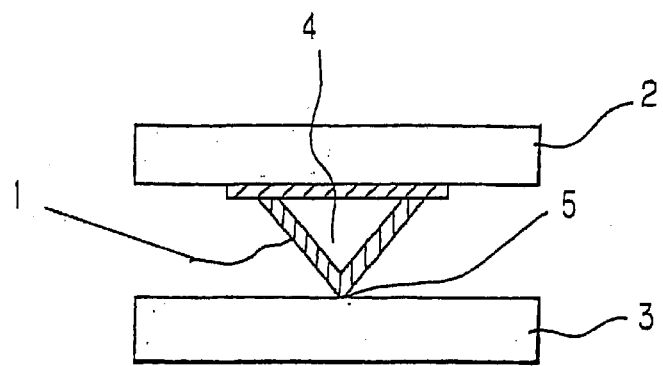
FIGS. 4A and 4B are cross sectional views showing an example of a bump structure according to the invention.
Figure 4B:
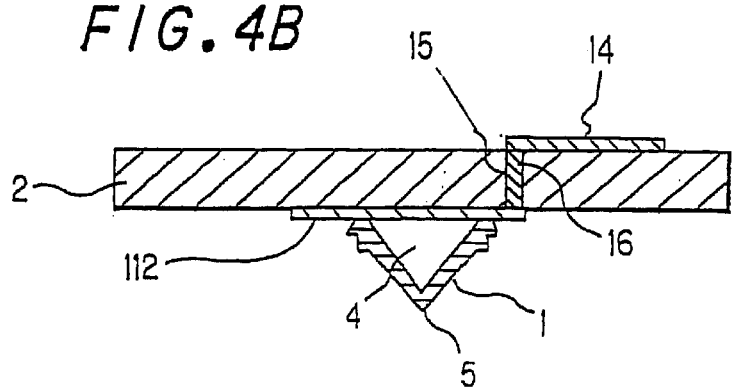

FIGS. 4A and 4B are cross sectional views showing the composition of an example of a bump structure 1 of the invention. In FIGS. 4A and 4B, the bump structure 1, which electrically connects a first member 2 and a second member 3, is composed of a cavity 4.

The bump structure 1 of the invention is preferably provided with at least one point-contact part 5.

Also, a bump-structure-forming member(hereinafter referred to as 'bump-forming member'), which composes the bump structure 1 of the invention, has the shape of a multangular pyramid including a quadrangular pyramid and a triangular pyramid, a cone or a hemisphere etc. Also, as shown in FIG. 5, it has a shape formed as a combination of at least two bump-forming members 11, 12 which have any of the above shape.

Figure 5:
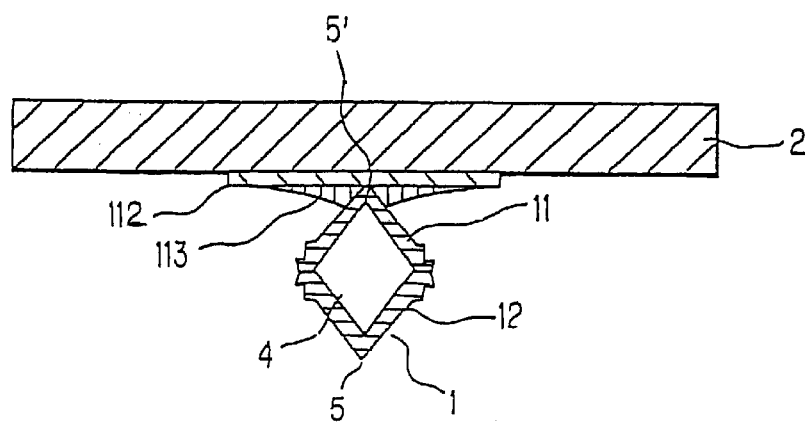
FIG. 5 is a cross sectional view showing another example of a bump structure according to the invention.

Namely, this example of the bump structure 1 of the invention and the other examples can be, as shown in FIG. 5, formed by bonding at least two bump-forming members so that to provide a cavity inside.

In these examples, the two mutually-bonded bump-forming members 11, 12 may be a same shape or different shapes to each other.

By reason that the bump structure 1 of the invention is composed as above-mentioned, the bump-forming member 11 may be, for example as shown in FIG. 4A, bonded directly to a proper substrate or through a proper bonding means to a predetermined electrode 6 of the electronic element 2. Alternatively, as shown in FIG. 5, the hollow bump structure 1 that the two bump-forming members 11, 12 are bonded mutually may be bonded directly to a proper substrate or through a proper bonding means to the predetermined electrode 6 of the electronic element 2.

Taking the case of FIG. 5, one protrusion 5' of the bump structure 1 is connected through a solder 113 to an electrode 112 disposed on a proper substrate 2.

FIG. 6 shows the case that the bump structure 1 in FIG. 5 is connected to another electronic element or substrate 3. Another protrusion 5 in FIG. 5 is connected through a solder 113 to an electrode 112 disposed on the substrate 3.

The bump structure 1 of the invention shown in FIGS. 5 and 6 can be transformed from the original shape, for example, when an external stress is applied in the direction of arrows a and b in FIGS. 7A and 7B or arrows c and d in FIGS. 7C and 7D. Therefore, it can absorb the external stress to stabilize the connection structure.

Similarly, the bump structure 1 can absorb a distortion even when a thermal stress is applied to the electronic element or substrate, or even when, at heating atmosphere, the dimensions of the electronic elements or substrates become different from each other due to the difference between the thermal-expansion coefficients of the electronic elements or substrates to be used.

Also, as shown in FIG. 7E, the bump structure 1 shown in FIGS. 4A and 4B can get the same effect as mentioned above by forming an opening 8 with a proper size at part of the bump structure 1 to make its own frame of the bump structure 1 flexible.

Such a flexible frame of bump structure can be, of course, applied to the other example of the invention in FIG. 5.

The bump structure 1 of the invention can be provided by making the bump-forming member 11 by forming a predetermined conductive film on a for forming bump-forming member, which is a proper substrate provided with a molding part to form the bump-forming member 11 to compose the bump structure 1, transferring it to a predetermined position of a proper substrate or a predetermined electronic element.

Therefore, a bump-forming member to form the bump structure can be provided with an arbitrary shape by properly designing the molding part disposed on the molding plate for forming the bump-forming member.

Moreover, in the invention, the molding part can be, as described later, easily formed and arbitrarily designed as to its size, height, shape, formation density etc.

Namely, the bump structure 1 of the invention is characterized by that it is composed transferred film formed by using a predetermined mold.

Further, in this invention, the bump structure 1 is desirably formed by at least one conductive film with a bent form, and is desirably composed by at least two films laminated.

Figure 40:
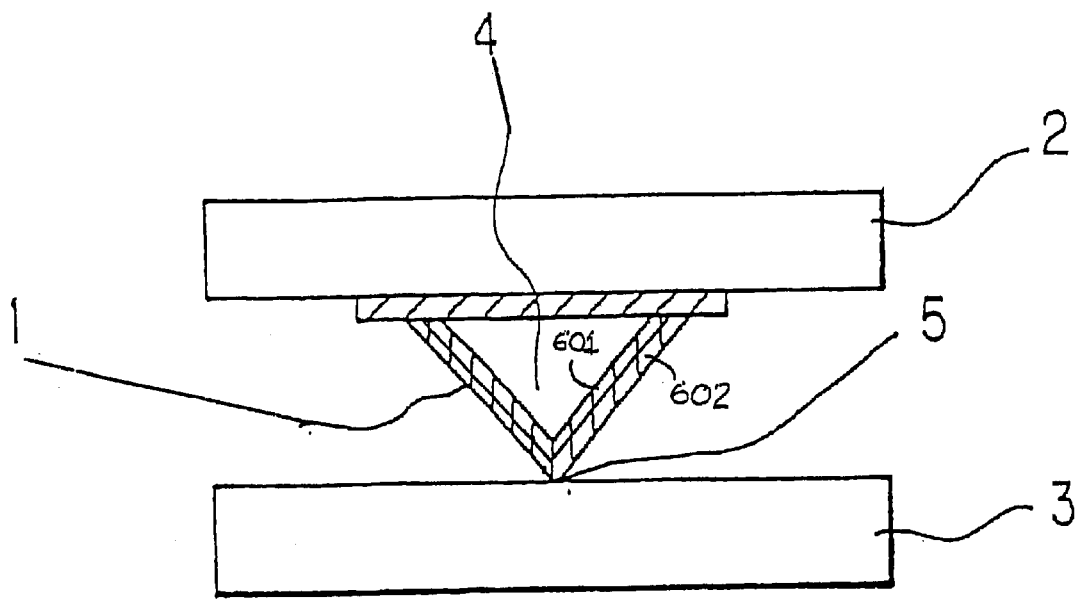
FIG. 40 illustrates an embodiment of the present invention including a two-layered structure.

In further detail, the at least two films to form the bump structure 1 are desirably composed of materials with characteristics different from each other. Specifically, it is desirable that, of the at least two films, a first film 601 to form the surface that directly contacts the electrode or terminal of a substrate to which the bump structure 1 faces is of rhodium or platinum and a second film 602 bonded to the first film is of nickel, as illustrated in FIG. 40.

A method for making the bump structure 1 in the invention will be explained below. Basically, it uses sputtering, etching, photolithography etc. Thereby, the design and fabrication of the bump structure 1 above-mentioned can be easily and efficiently conducted.

An example of the method for making the bump structure 1 in the invention will be explained, referring to FIGS. 8A to 11B.

First, as a first step to make the bump structure 1 of the invention, a molding plate will be made provided with such a predetermined molding part that the bump-forming members 11 or 12 to form the bump structure 1 can preferably have its tip portion with a pointed or point contact.

Namely, FIGS. 8A to 8E show an example of a method of making a molding plate 10 for forming the bump-forming member by using a silicon wafer to mold, for example, the bump structure 1 with the shape shown in FIGS. 4A and 4B.

This example is shown for the case that the molding plate 10 is made so that the bump-forming member 11 to form the bump structure 1 in FIGS. 4A and 4B has a quadrangular pyramid form. The shape, arrangement interval, size and arrangement form of the molding part 104 can be, as described earlier, suitably changed according to the arrangement state of electrodes or terminals of electronic element desired to form the connection structure.

Also, FIGS. 8A to 8E show the method for making the molding plate 10 for forming the bump structure.

Figure 8A:
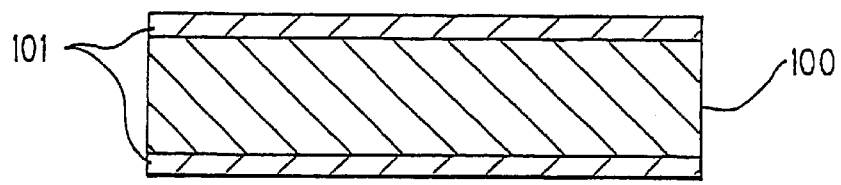
FIGS. 8A to 8E are cross sectional views showing an example of a method of making a molding plate for forming bump-forming member used in the invention.

As shown in FIG. 8A, a (100)-crystal-orientation silicon wafer substrate 100 with a diameter of 6 inches and a thickness of 1 mm is prepared, and thermal oxidation films 101 of 1 µm thick are formed on both surfaces of this wafer.

Figure 8B:
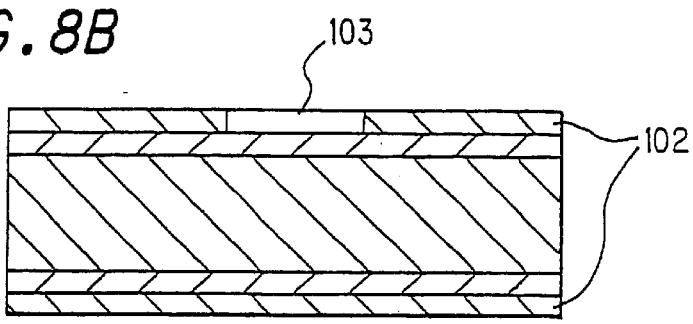

Then, as shown in FIG. 8B, photoresist 102 of 5 µm thick is coated. This is exposed using a predetermined mask and developed to form an aperture 103 in the photoresist 102.

The aperture 103 is opened corresponding to a position of IC electrode to which a point-contact terminal is transferred. The sides of the aperture 103 are parallel or perpendicular to <100>.

Figure 8C:
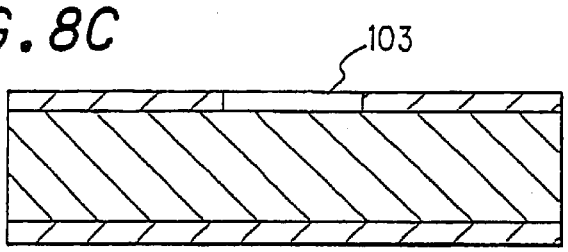

As shown in FIG. 8C, the silicon wafer 100 is treated with buffered hydrofluoric acid to remove the thermal oxidation film under the aperture 103 in the photoresist 102, and then the photoresist 102 is removed by solvent.

Figure 8D:
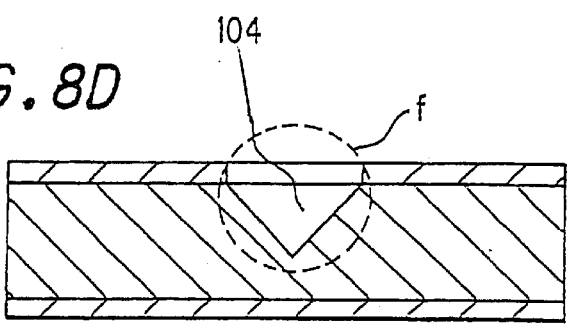

Then, as shown in FIG. 8D, the silicon wafer 100 is anisotropic-etched with 10% potassium hydroxide solution to make a concavity (etch pit) 104 with (111) plane.

Figure 8E:
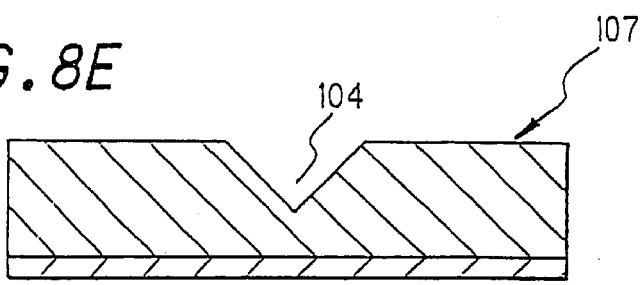
Figure 9A:
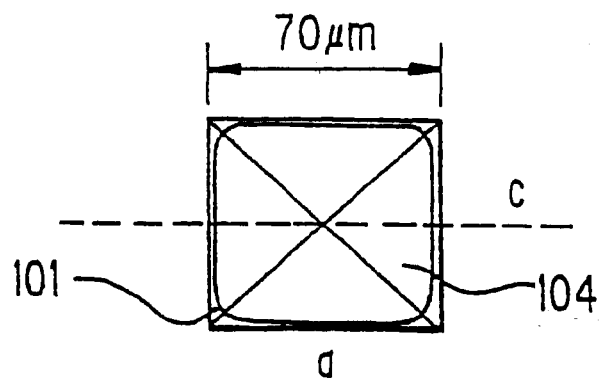
FIG. 9A is a top view showing the details of an etch pit used in the invention.
Figure 9B:
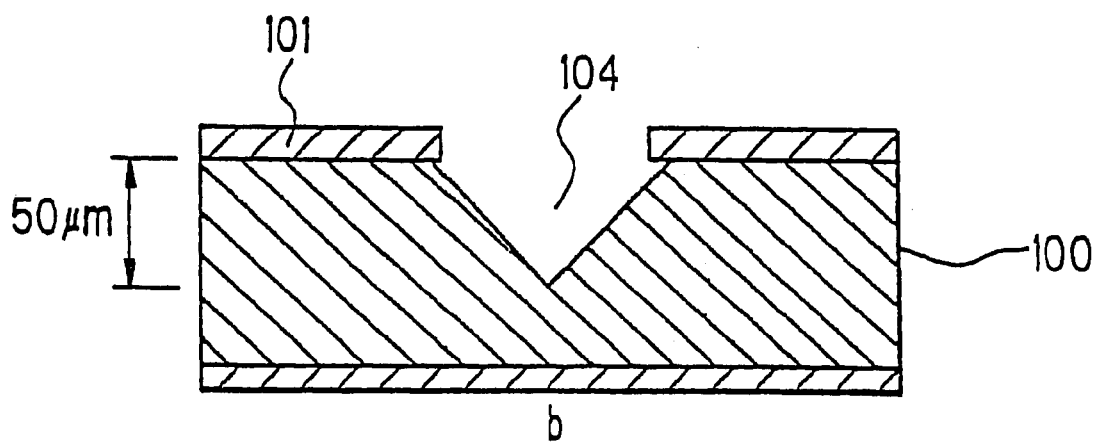
FIG. 9B is a cross sectional view showing the details of an etch pit used in the invention.

The details of part f in FIG. 8D are shown in FIGS. 9A and 9B. As shown in FIGS. 9A and 9B, in the after-etching stage, the thermal oxidation film 101 is formed protruding into the etch pit 104 and such part causes hooking in the later transfer process. Therefore, as shown in FIG. 8E, the thermal oxidation film 101 over the etch pit 104 is thoroughly removed by treating with buffered hydrofluoric acid.

The thermal oxidation film 101 is left on the back face of the substrate 100 to insulate it. Because of this, the back face does not need to be masked in the later plating process.

By the above processes, the molding plate 10 for forming the bump-forming member is made.

Next, a method for making the bump-forming member 11 or 12 by using the molding plate 10 for forming the bump-forming member will be explained, referring to FIGS. 10A to 10F.

Figure 10A:
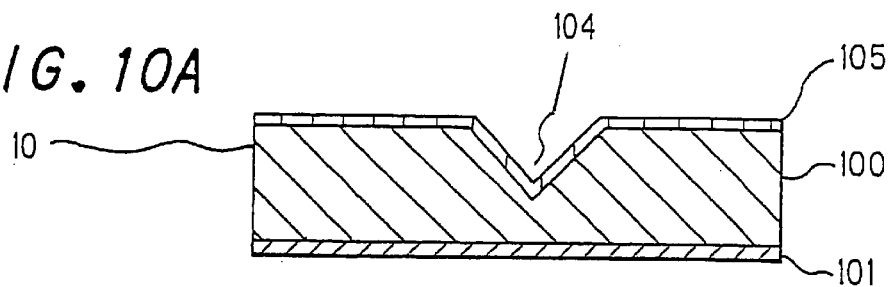
FIGS. 10A to 10F are cross sectional views showing an example of a method of making a bump structure according to the invention.
Figure 10B:
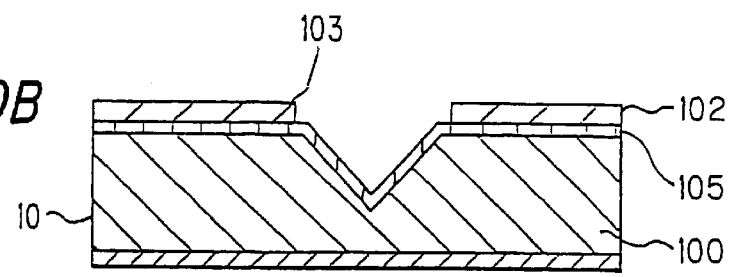

As shown in FIG. 10A, 1 $\mu$m sputtered film 105 of copper is formed on the molding plate 10 for forming the bump-forming member. Then, as shown in FIG. 10B, photoresist 102 of 15 $\mu$m thick is coated, and then an aperture 103 is formed by exposing the photoresist 102 with a predetermined pattern.

Figure 11A:
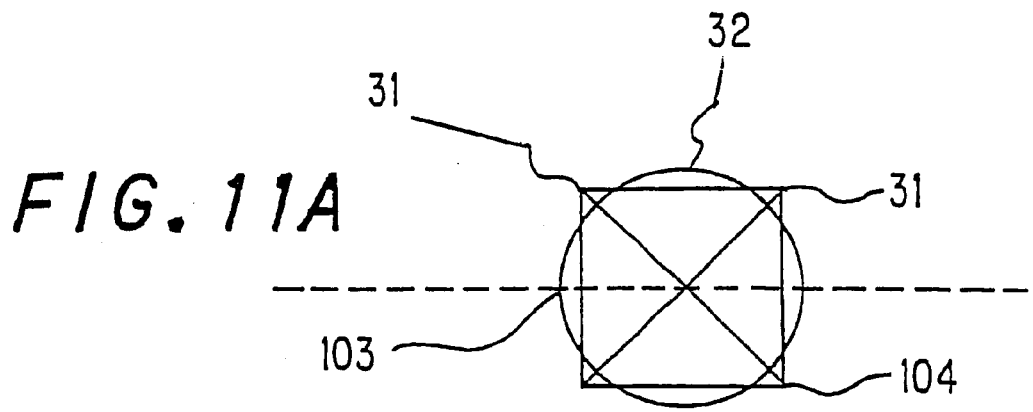
FIGS. 11A and 11B are top views showing an etch pit and an aperture of photoresist according to the invention.

In this process, as shown in FIG. 11A, edge part 32 of the aperture 103 is controlled to be, e.g., 5 $\mu$m smaller than a corner 31 of the etch pit 104 in the molding plate 10 for forming the bump-forming member.

Then, by laminating films of, e.g., 1 $\mu$m rhodium, 10 $\mu$m nickel and 5 $\mu$m gold thereon in this order by electrolytic plating, plated film 106 to compose the bump-forming member 11 is formed.

In this invention, it is advantageous for the separation and transfer processes, described later, of the invention that the first layer to contact directly the electrode or terminal of an inspected electronic element uses rhodium with a high film stress as well as a conductivity. However, platinum can be also used, as the case may be.

Figure 10C:
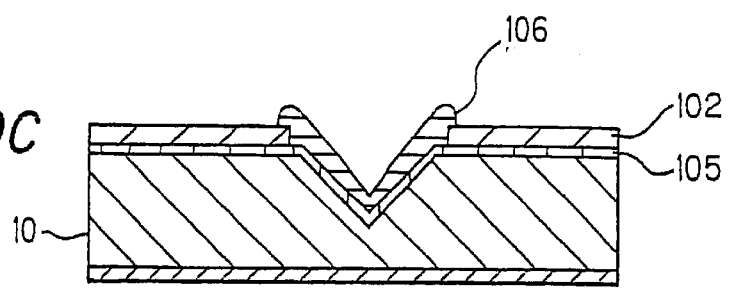
Figure 10D:
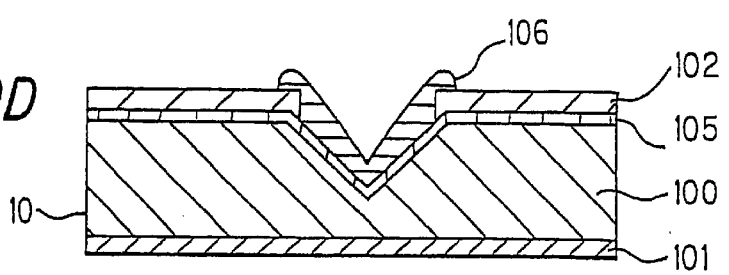
Figure 11B:
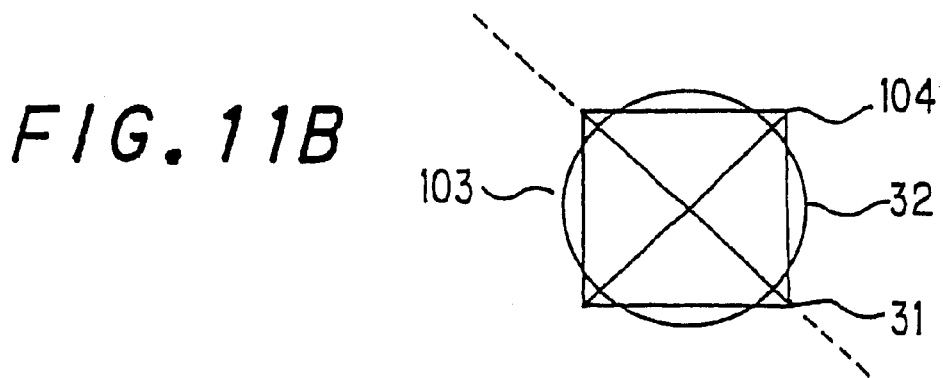

FIG. 10C is a cross sectional view cut along the dotted line in FIG. 11A, and FIG. 10D is a cross sectional view cut along the dotted line in FIG. 11B.

Namely, in this invention, in forming the plated film 106, photoresist 102 is left on at least one corner 31 of the etch pit 104 so as not to form the plated metal film above-mentioned on that part. This structure allows the plated metal film 106 to be easily released from the silicon mold 104.

Figure 10E:
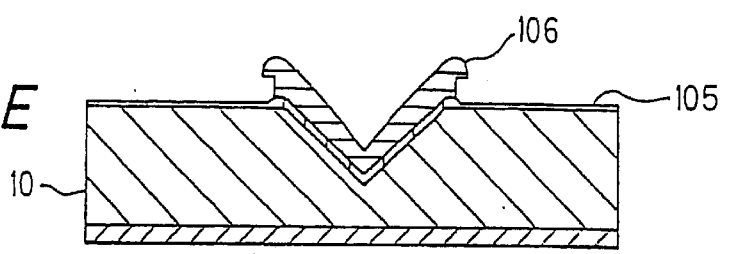
Figure 10F:
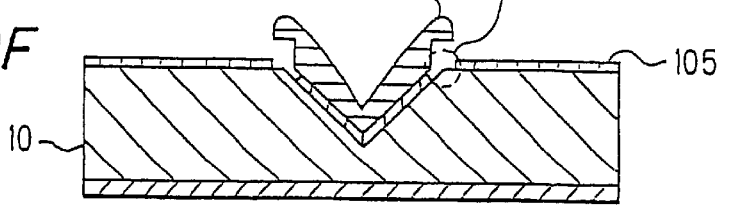

As shown in FIGS. 10E and 10F, after removing the photoresist 102, it is soaked in a solution of 5% sulfuric acid and 5% hydrogen peroxide for 20 seconds to etch the copper sputtered film 105 by 0.5 $\mu$m, then washed by pure water.

FIG. 10F is a cross sectional view showing the state after etching the sputtered film 105 in FIG. 10E.

Figure 12:
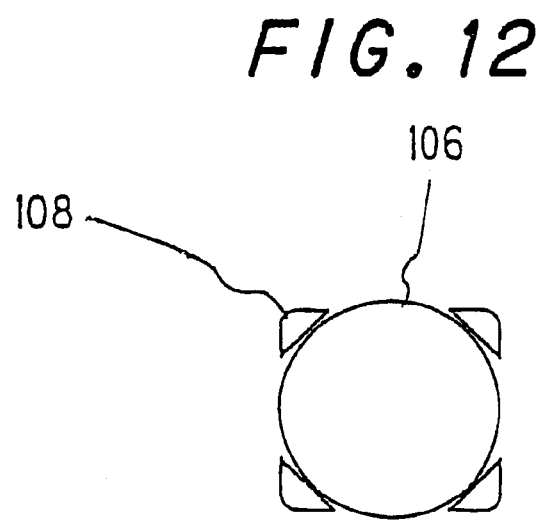
FIG. 12 is a top view showing the shape of plated film in a bump-forming member according to the invention.

As shown in FIG. 12, the copper sputtered film 105 is partially etched to make exposed part 108 where the underlying silicon wafer 100 is exposed. In this case, etching of the exposed part 108 can be easily conducted because the corner 31 is not covered with the plated film 106. Also, the etching rate at the boundary of the etch pit and the silicon wafer surface is higher than that at the plane because the boundary is shaped convex.

In this process, metal of the plated film 106 to form the tip portion 5 of the bump structure 1 of the invention can also dissolve when it is of some material, e.g., nickel. However, it makes no problem because the amount of dissolution is up to about 2 $\mu$m.

By thus processing, in the later process, the plated film 106 can be easily released from the etch pit 104 of the molding plate 10 for forming the bump-forming member when the bump-forming member 11 is transferred to a proper electronic element or substrate.

Also, in this invention, the thermal oxidation film 101 on the silicon substrate 100 is removed, and the film can be therefore easily released without being hooked by any structural part.

Next, an example of a method of transferring the bump-forming member 11 formed on the molding plate 10 for forming the bump-forming member to a proper substrate 2 will be explained.

Figure 13:
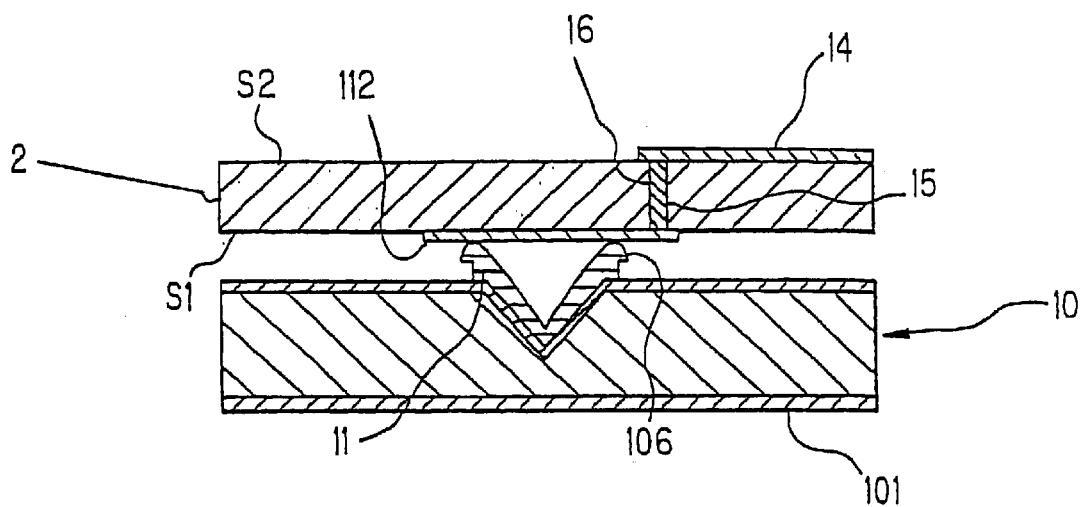
FIG. 13 is a cross sectional view showing a transfer operation in a method of making a bump structure according to the invention.

Namely, as shown in FIG. 13, the bump-forming member 11 described above is formed on the molding plate 10 for forming the bump-forming member.

Though in this invention a plurality of the bump-forming members 11 are, of course, formed on the molding plate 10 for forming the bump-forming member with a predetermined arrangement density and a predetermined arrangement form, the following explanations will be given provided that one bump-forming member 11 is, convenience of explanation, formed.

For example, on the molding plate 10 for forming the bump-forming member, the etch pits 104 are disposed at intervals of 250 $\mu$m. Namely, similar patterns exist within 10 mm×10 mm and the total number of the etch pits 104 is 1600.

As shown in FIG. 13, for example, a substrate 2 where a proper electrode 112 is formed on its principal plane S1 is prepared additionally.

For example, the substrate 2 may be composed so that the electrode 112 is electrically connected through a conductive member 16 filled in a via hole 15 penetrating the substrate 2 to a wiring 14 formed on another principal plane S2.

Then, the substrate 2 and the bump-forming member 11 formed on the molding plate 10 for forming the bump-forming member are mutually jointed while aligning by using a proper device, for example, both are jointed and fixed by heating and pressing.

Then, when the release operation is conducted by moving the molding plate 10 for forming the bump-forming member and the substrate 2 in the directions that both are distanced from each other, the bump-forming member 11 composed of the plated film 106 can be transferred to the substrate 2, thereby obtaining the bump structure 1 shown in FIGS. 4A and 4B.

In FIG. 13, when the plated film 106 and the electrode 112 are composed of aluminum, by heating at 350° C. and pressing at 20 g after the aligning, the plated film 106 can have been transferred to the electrode 112.

The bump structure 1 of the invention is, as apparent from the above explanations, fixed to a predetermined principal plane of at least one body.

Figure 14:
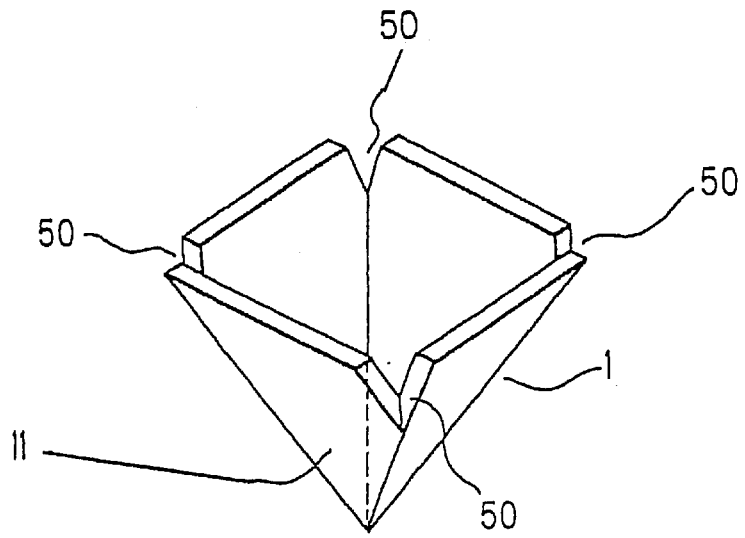
FIG. 14 is a perspective view showing an example of notch shape in a bump-forming member according to the invention.

In this invention, notched part 50 shown in FIG. 14 is formed by, as described above, disposing photoresist on at least a part of the corner 31 of the etch pit 104, the molding part formed on the molding plate 10 for forming the bump-forming member, so as not to form the plated film 106 on that part. Therefore, when applying a releasing stress after compression-bonding the bump-forming member 11 to the electrode 112, the concentration of stress occurs at that part to promote the releasing at the interface of the plated film 106 and the silicon wafer.

Also, by removing the copper film by etching as shown in FIG. 10F, the releasing of the plated film 106 from the silicon wafer can be further promoted.

Therefore, the occurrence of non-transfer failure can be suppressed when the point-contact terminal is transferred.

After the transferring, the surface of the bump-forming member 11 including copper sputtered film 105 and the etch pit 104 of the molding plate 10 for forming the bump-forming member is etched by a solution of 5% sulfuric acid and 5% hydrogen peroxide for 60 seconds, then washed to remove them.

Figure 15A:
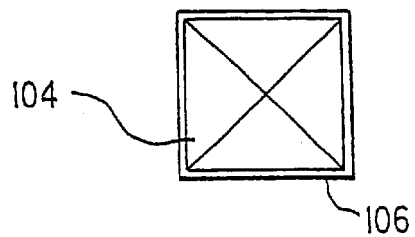
FIG. 15A is a top view showing an etch pit and an aperture of photoresist to be made by a conventional method.
Figure 15B:
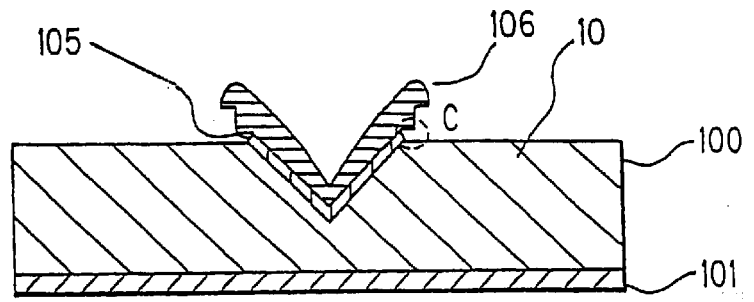
FIG. 15B is a cross sectional view showing an etch pit and an aperture of photoresist to be made by a conventional method.

As a comparative example, different from the structure of the invention, a probe with a point contact terminal formed by the conventional method, where the plated film 106 is continuously formed around the etch pit 104 as shown in FIGS. 15A and 15B, is formed. The releasing effect in the transfer operation is compared and considered.

For the bump-forming member 11 by the conventional method, even when etching the copper sputtered film 105, the corner 31 can be etched only from its edge because it is covered with the plated film 106 as shown by part c in FIG. 15B.

Therefore, the etch process is delayed, and it can be etched about 10 $\mu$m when the sputtered film 105 for a long time is etched. The etch depth depends on a dispersion in the etch condition, pattern precision, thickness of plated film and film stress.

Namely, in the conventional method, the etch rate is dispersed depending on the bump-forming member 11. Therefore, for the high etch rate, the most part of copper has to be etched and the bump-forming member 11 has to be released from the casting mold 10 when being washed before the transferring.

Also, there occurs the problem that nickel etc. in the plated film 106 to form the bump-forming member 11 can dissolve by 10 $\mu$m to 20 $\mu$m.

Next, the release and transfer test of the bump-forming member 11 was conducted using the bump-forming member 11 obtained by the method of this invention and the bump-forming member 11 formed by the conventional method mentioned above.

The bump-forming members 11 used in this test are arranged square on a six-inch wafer, and the total number of point-contact terminals is 32000.

The results of the case that they are transferred to the aluminum electrodes of an IC-formed wafer at 20 g per point-contact terminal while heating at 350° C. for 10 seconds are as follows:

|  | bump-forming member: number of good transferred products/total number |
|---|---|
| bump-forming member with notched corner | 100/100 |
| bump-forming member without notched corner | 5/100 |

Namely, in the bump-forming member 11 without the notched corner 31, the transfer ratio cannot be enhanced because the releasing of the bump-forming member 11 is not promoted. In the case that the etch time for copper before the transferring is lengthened to enhance the transfer ratio in case of no notched corner 31, the number of bump-forming members dropping before the transferring and the number of transferred bump-forming members are as follows:
The cause of transfer failure in bump-forming member without notched corner (number of ICs)

| The cause of transfer failure in bump-forming member without notched corner (number of ICs) | | | |
|---|---|---|---|
| etch time (sec) | number of good transfer | number of dropping | number of members left on bump-forming mold |
| 10 | 5 | 0 | 95 |
| 100 | 3 | 38 | 59 |
| 200 | 0 | 98 | 2 |

Judging from the above experimental results, the transfer ratio is low because the bond strength between the wafer and the plated film when the etch time of the sputtered film 105 is short. The plated film 106 is released from the substrate in the process of before the transferring when the etch time is long.

The Silicon wafer used in forming the bump-forming member is reused after dissolving all copper by soaking it in an etch solution of sulfuric acid and hydrogen peroxide.

Pollution etc. adhered in the process can be released by dissolving copper. Thus, even when using it many times, there does not occur the problem that pollution is adhered.

In contrast with this invention, in case of the structure in Japanese patent application laid-open No. 1-98238, the mold must be discarded because there is no method for releasing Pt film when the Pt film is injured.

Further, the following comparison experiment is conducted so as to check out the difference on effect between the bump structure with hollow body of the invention and the conventional cylindrical and solid-core type bump structure.

Namely, for the bump structure of the invention and the convention bump structure, the comparison experiment as to the absorption of dispersion in the height of an electrode to be bonded with them is conducted.

Test Method:
A test to connect an IC chip that aluminum electrodes are formed on a silicon wafer of 10 mm×10 mm, 470 $\mu$m thick with a glass ceramic substrate is conducted.

Figure 35:
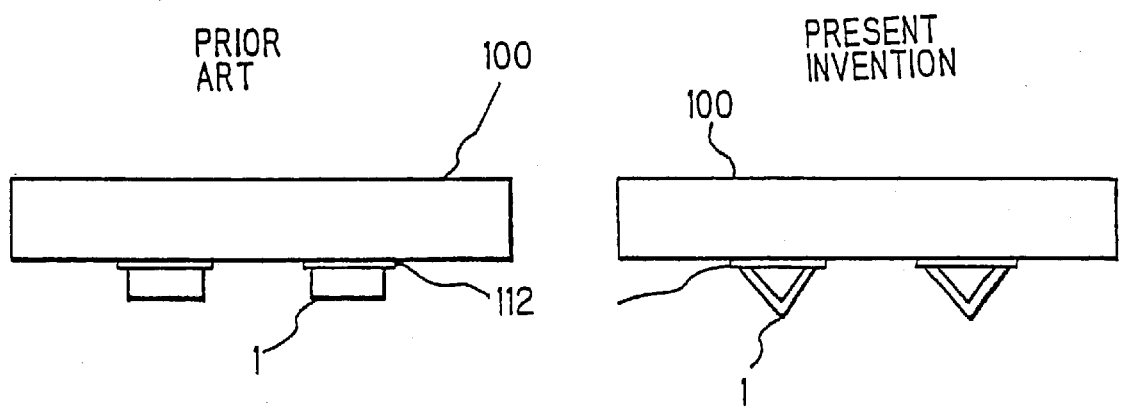
FIG. 35 is an illustration showing both a conventional bump structure and a bump structure of the invention used in the comparison experiment.

320 chip electrodes are disposed at pitches of 120 $\mu$m around the chip. As the bump to connect this chip to the glass ceramic substrate, the conventional cylindrical (the entire core is filled with plating metal) bump shown in FIG. 35A and the hollow bump of the invention shown in FIG. 35B are used.

On the aluminum electrode of the chip, 1 $\mu$m thick electroless zinc plated film, 1 $\mu$m thick electroless nickel plated film and 1 $\mu$m thick electroless gold plated film are formed.

Figure 36:
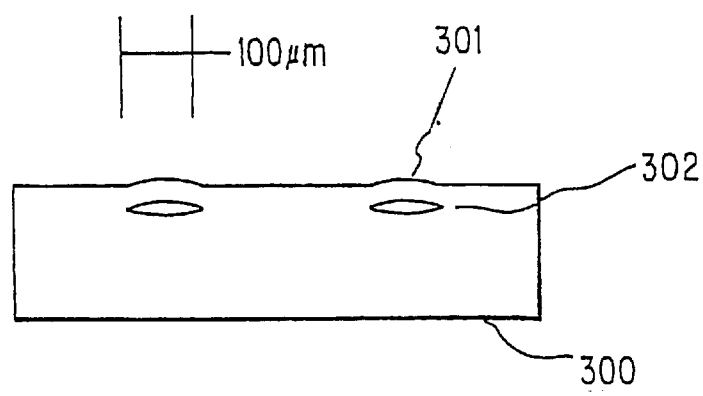
FIG. 36 is an illustration showing a substrate used in the comparison experiment.

As shown in FIG. 36, the glass ceramic substrate 300 used herein is a multilayer wiring substrate, and the surface of the substrate is so mounded by about 5 $\mu$m over about 100 $\mu$m wide as to provide convex parts 301 due to inner-layer wirings 302.

On this substrate 300, there are electrodes formed corresponding to the chip electrodes. Most of the electrodes are formed on even places on the substrate, but about 10 electrodes are formed on the convex parts.

Figure 37:
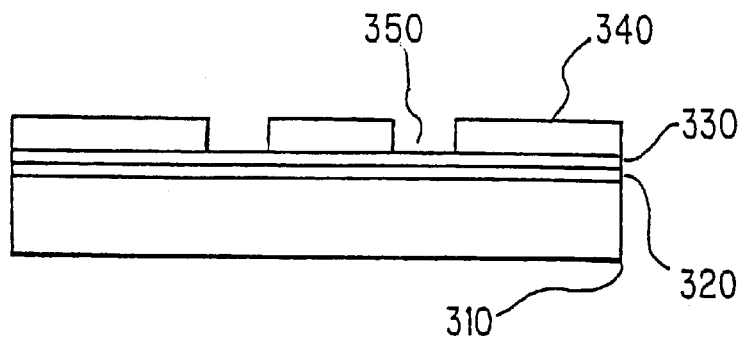
FIG. 37 is a cross sectional view showing a method of making a conventional cylindrical bump.

An example of the process of forming the bumps on the chip is shown in FIG. 37.

The cylindrical bump has a diameter of 60 μm and a height of 30 μm. This bump is made as described below.

As shown in FIG. 37, on the glass substrate, chrome-sputtered film, palladium-sputtered film 320 and ITO conductive film 330 are formed. Then, plating resist 340 is coated thereon to form a pattern of apertures 350 of 60 μm wide and 30 μm thick.

On the glass substrate 310, 2 μm gold plated film, 2 μm nickel plated film and 2 μm gold plated film are formed by electrolytic plating.

The bump of the invention is of 70 μm bottom and 50 μm high. The composition of material is 5 μm gold, 10 μm nickel and 1 μm rhodium, from the inside of the bump plated film.

This is aligned to the chip electrode, pressed at a load of 50 g per bump while heating the transfer substrate at 350° C., transferred to the chip electrode.

These bump-formed chips are pressed aligning to the electrode of the glass electrode. In the conventional bump, even when the pressure to press the chip is increased to 20 kg, there are some electrodes unconnected.

The unconnected electrodes are for two to three bumps adjacent to the convex part shown.

When the chip using the bump of the invention is similarly pressed, all the electrodes can be connected at a pressure of 500 g.

This is because the bump of the invention is easy to transform as it is formed with 16 μm thick plated film and it is hollow and because it is further easy to transform as the plated film of the bump is partially notched around the connection part of the chip and the bump.

Also, it is because the connection part is not opened even when the distance between the chip and the substrate varies about 3 μm, as most of the transforming of plated film is composed of elastic transform.

Figure 38:
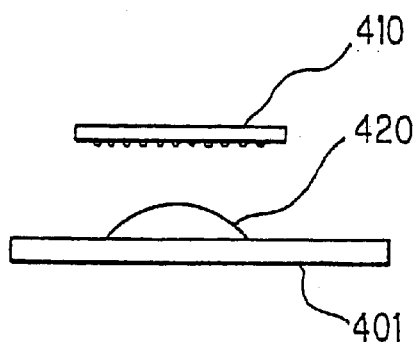
FIGS. 38 and 39 are cross sectional views showing a method of making a sample for reliability test.
Figure 39:
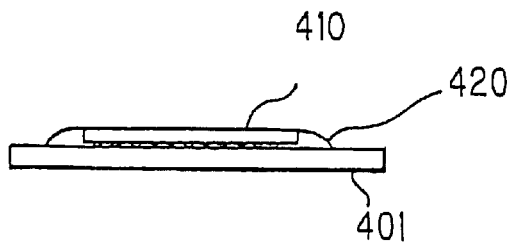

Reliability Test Results:

In the same way as described above, the conventional cylindrical bump and the bump of the invention are transferred to a chip 410. This is, as shown in FIGS. 38 and 39, connected to electrodes on an alumina substrate 400, then sampled for the reliability test.

The connection is made as shown. The procedures are as follows:

Epoxy resin 420 including 70 wt % silica filler is dropped at the center position of the alumina substrate 400 to mount the chip 410, and then the chip 410 bump-formed is aligned and pressed against here.

A load to press is 20 kg for the cylindrical bump and 1 kg for the bump of the invention. By heating at 200° C. for 1 min. in this state, epoxy resin is hardened and sampled for the reliability test.

In this sample, the bump formed on the chip and the electrode of the substrate are kept pressed to each other by the hardened resin.

Reliability test conditions:

A heat cycle test where a retention at −40° C. for 30 min. and a retention at 120° C. for 30 min. compose one cycle is conducted. Measuring the resistivity of connection part, a failure is determined when the resistivity increases higher than 20%. For each sample, 10 chips are tested.

| | test result (number of good chips) | | | | |
|---|---|---|---|---|---|
| number of cycles | 100 | 200 | 400 | 600 | 1000 |
| conventional | 10 | 10 | 8 | 3 | 0 |
| present invention | 10 | 10 | 10 | 10 | 10 |

In the bump of the present invention, the connection failure does not occur until 1000 cycles.

In the heat cycle, a shear stress is applied among the chip, epoxy resin and alumina substrate because their thermal expansion coefficients are different from each other. The thermal expansion coefficients are as follows:

chip: 3 ppm epoxy resin: 30 ppm alumina substrate: 10 ppm

Due to such differences on thermal expansion coefficient, a stress is applied repeatedly. In this case, when using the conventional cylindrical bump for the connection part, the connection part must be opened when the distance between the chip and the alumina substrate is widened by that epoxy rein is transformed only a bit (for example, 2 μm) by repeated stress, because it has little elasticity.

The bump of this invention is elastic-transforming by about 5 μm while being pressed by a load of 1 kg to be applied when making the sample. even when epoxy resin is similarly transformed, the connection part is not opened because it can transform by the restoring force based on the bump's elasticity. Therefore, it presents excellent connection reliability.

Next, an example of a method of making the bump structure 1 of the invention composed as shown in FIG. 5 will be explained.

Namely, in this example, using the steps up to FIG. 10F, two bump-forming members 11, 12 with a same structure or slightly different structures are made by using separate molding plates 10, 10' for forming the bump-forming member.

For example, like the example in FIGS. 10A to 10F, by forming an etch pit 104 with a predetermined shape on a six-inch silicon wafer, the two molding plates 10, 10' for forming the bump-forming member are made. By conducting the same operations as in FIGS. 10A to 10F, copper sputtered film 105 and photoresist 102 are formed.

Figure 16A:
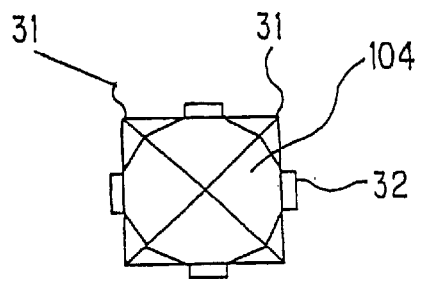
FIGS. 16A and 16B are top views showing an aperture of etch pit used to make another example of bump structure according to the invention.
Figure 16B:
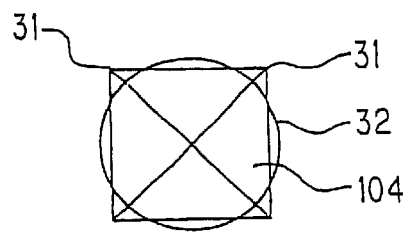

In this example, photoresist to cover the corner 31 of the etch pit 104 is preferably of patterns different from each other as shown in FIGS. 16A and 16B, while it may be of the same pattern.

This is advantageous when conducting separately the transfer operation of the bump-forming member 11, described later, from the two molding plates 10, 10' for forming the bump-forming member 11.

For example, as shown in FIGS. 16A and 16B, they have different patterns of photoresist 102, where parts to cover the corner of the etch pit 104 in photoresist 102 have different sizes.

Namely, one molding plate 10' for forming the bump-forming member has the pattern shown in FIG. 16A, where photoresist 102 covers 15 μm from the corner 31 of the etch pit 104. The other molding plate 10 for forming the bump-forming member has the pattern shown in FIG. 16B, where photoresist 102 covers 5 μm from the corner 31 of the etch pit 104.

On each of the two molding plates 10, 10' for forming the bump-forming member, like the first example described earlier, 1 μm rhodium, 10 μm nickel and 5 μm gold are laminated, thereby plated film 106 is formed. Then, the bump-forming substrates 10, 10' are soaked in a solution of sulfuric acid and hydrogen peroxide for 20 seconds to slightly etch the copper sputtered film 105, then washed.

Figure 17:
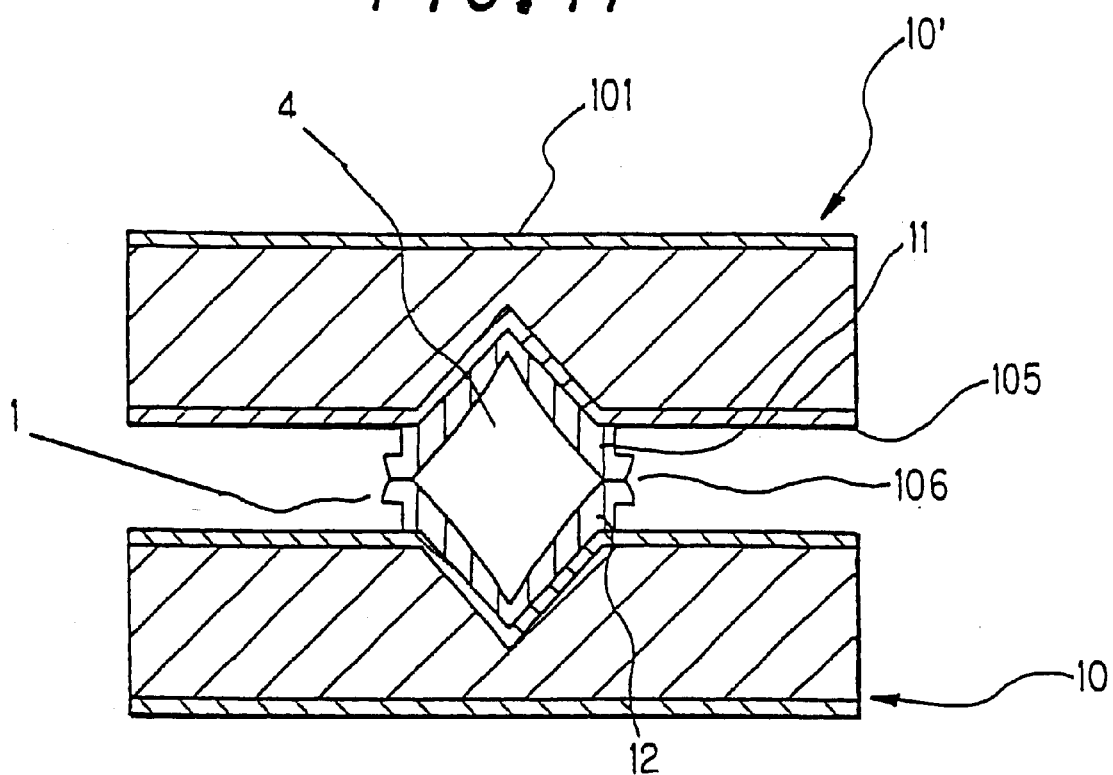
FIGS. 17 to 23 are cross sectional views showing an example of a method of making another bump structure according to the invention.

The two bump-forming members 11, 12 thus formed are, as shown in FIG. 17, aligned, bonded and fixed together while heating at 350° C. and pressing at 50 g per bump.

Namely, in the second example of the invention, the two bump-forming members 11, 12 made via separate processes as described above are bonded while their opened ends, i.e., the outermost ends of the bump-forming members 11, 12, are faced to each other, so that a cavity is formed inside.

Further, this invention is characterized by that there is formed at least one notched part 50 near the outermost ends of the two bump-forming members 11, 12 mutually bonded.

Such notched part 50, as described earlier, has the effect that it allows the plated film to be easily released from the substrate when separating the bump-forming members 11, 12 from the molding plates 10, 10' for forming the bump-forming member so as to transfer them.

Further, in this invention, it is desirable that the notched parts 50 formed near the outermost ends of the two bump-forming members 11, 12 mutually bonded have shapes different from each other.

Namely, in this example of the invention, by separating the bump-forming members 11, 12 from the molding plates 10, 10' for forming the bump-forming member in the transfer operation described above, the bump structure 1 with pointed ends is formed.

Figure 18:
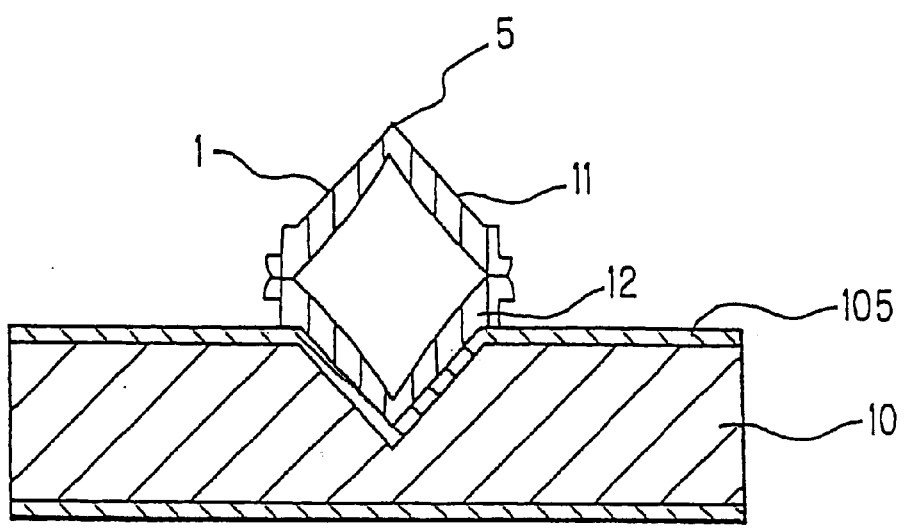

Also, when separating the molding plate 10' for forming the bump-forming member, as shown in FIG. 18, the plated film 106 on the molding plate 10' for forming the bump-forming member can be released easier than on the molding plate 10 for forming the bump-forming member, because the patterns of the plated film 106 are different between the two bump-forming members 11, 12, as described above.

Further, for example, by etching only the copper sputtered film 105 of the molding plate 10' for forming the bump-forming member, only the plated film 106 of the bump-forming member 11 with the pattern in FIG. 16A is released as shown in FIG. 18.

Then, the bump-forming member 12 with the pattern in FIG. 16B to which the bump-forming member 11 is transferred is soaked in a solution of 5% sulfuric acid and 5% hydrogen peroxide for 20 seconds to partially etch the copper sputtered film 105, then washed.

Figure 19:
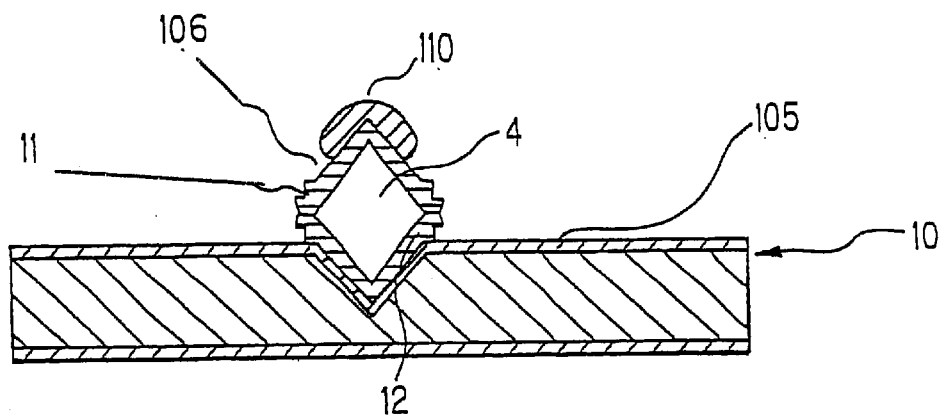

This is pressed against a substrate coated with flux of 20 $\mu$m, thereby the flux 110 is transferred as shown in FIG. 19.

Figure 20:
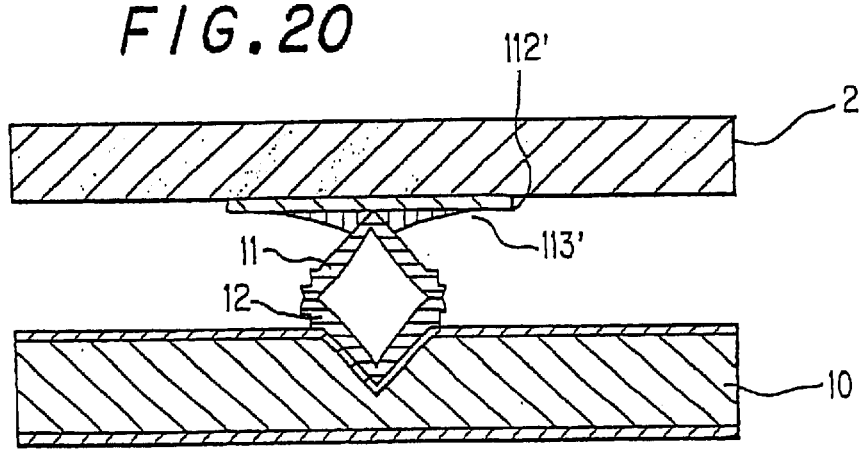

Then, as shown in FIG. 20, it is soldered to the copper electrode 112', on which solder 113' is coated, of, e.g., an IC-formed electronic part or proper substrate 2 while heating at 250° C. After cooling, by separating the molding plate 10 for forming the bump-forming member, the bump structure 1 as shown in FIG. 5 is obtained.

Cutting the substrate composed of IC wafer 2 etc. where the bump structure 1 is thus formed, a predetermined electronic part, e.g., an IC chip, is obtained.

In conducting the electrical test of a bare chip, IC 2 with the bump structure 1 composed according to the invention can be electrically connected if only it is aligned and pressed to the electrodes of an inspecting wiring board, because the bumps 1 on IC 2 are pointed and uniform in height and because the center part of bump is elastic.

Therefore, a conventionally-used probe card is not necessary and a bare chip tested can be obtained at a low cost.

Also, in this invention, as shown in FIG. 6, IC 2 with the bump structure 1 is aligned and bonded to the electrode 112 of the wiring board 3 with solder 113 while heating at 250° C. It can be easily mounted because the electrode pitch is as narrow as 60 $\mu$m and the bump height is 60 $\mu$m.

In the bump structure 1 of the invention, even when strain is applied to the connection part due to a thermal-expansion difference between IC and the material of wiring board as the surrounding temperature varies after connecting with the electrode of an electronic part such as IC or a wiring board, the shearing transform strain can be absorbed because the bump film can transform around the center of the bump structure 1 as shown in FIGS. 7A and 7B. Therefore, the reliability of connection part can be obtained even when the thermal-expansion difference between IC and the wiring board exists.

Next, a third example of the bump structure 1 according to the invention will be explained.

In this example, a bump structure with a high aspect ratio is made. Especially the process of connecting IC2 to the aluminum electrode 112 will be explained below.

Figure 21:
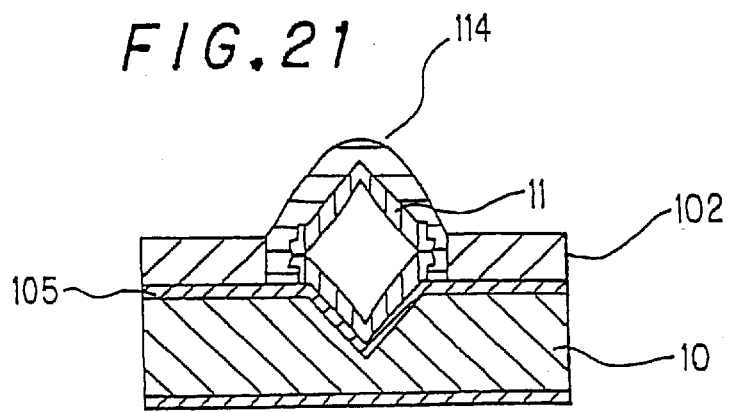

Like the second example of the invention, by heating and pressing the two molding plates 10, 10' for forming the bump-forming member, the bump is transferred from one wafer 3 to another. As shown in FIG. 21, resist 102 is coated on the wafer 3 on which the bump-forming member 11 is formed, the bump 11 is exposed by patterning, electrolytic gold plating 114 of 10 $\mu$m is formed thereon.

Figure 22:
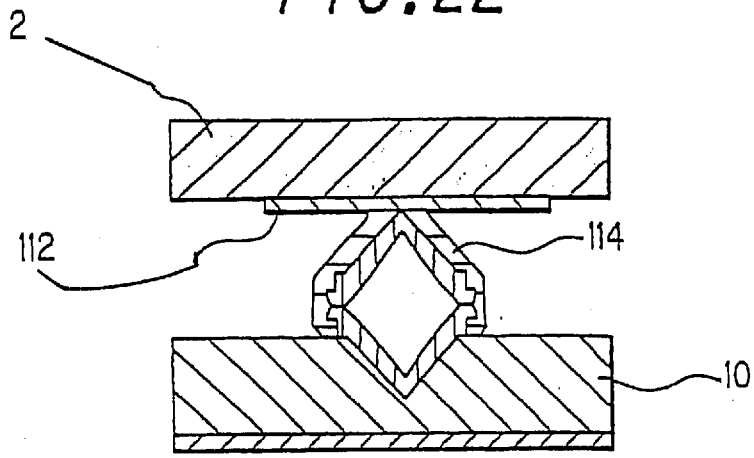
Figure 23:
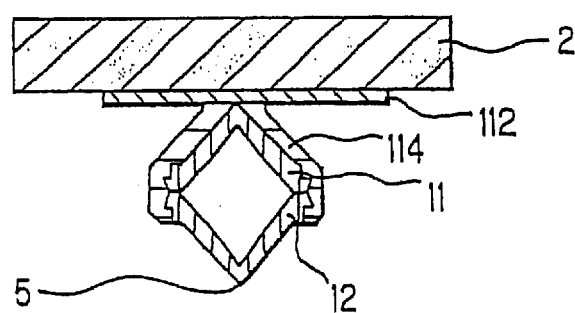

This is aligned to the aluminum electrode 112 of IC 2, then the bump is transferred while heating at 350° C. and pressing at 20 g per bump. The cross sectional form after the transferring is shown in FIG. 22.

In this example, the bump structure with an aspect ratio larger than the above-mentioned examples can be formed. Also, the connection part of IC 2 to the electrode 112 is located at the center of the electrode. Therefore, it can be connected to a smaller electrode.

A fourth example of the bump structure 1 according to the invention will be explained below.

In this example, like the first example, the molding plate 10 for forming the bump-forming member is made, the copper sputtered film is formed thereon, photoresist is coated. After plating 1 $\mu$m rhodium and 10 $\mu$m nickel thereon, 5 $\mu$m tin-zinc eutectic solder, in place of gold plating in the first example, is plated.

This plated film is formed into the bump by melting the copper electrode of IC and the solder. This example is suitable for the case that the bump structure is formed on area-bump IC etc. where electrodes are formed at the entire device-forming region unbearable to temperature and pressure to be thermally-compressed with gold.

A fifth example of the bump structure 1 according to the invention will be explained below.

In this example, the bump structure 1 is characterized in that it is composed of at least two bump structures, which are superposed in the same direction, with a same structure or different structures.

Figure 24:
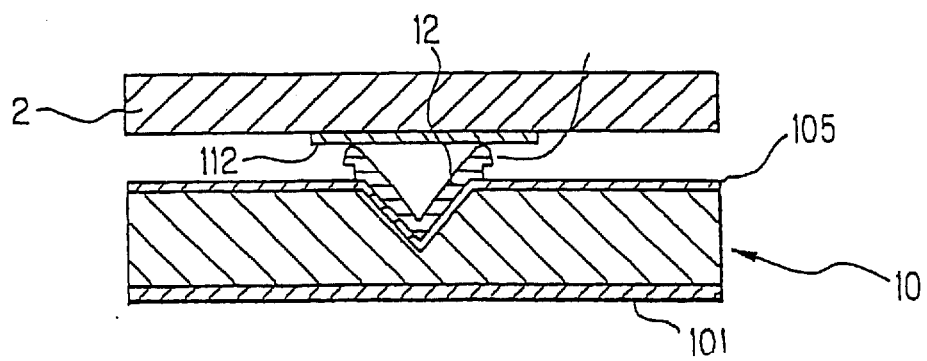
FIGS. 24 to 26 are cross sectional views showing an example of a method of making a further bump structure according to the invention.
Figure 25:
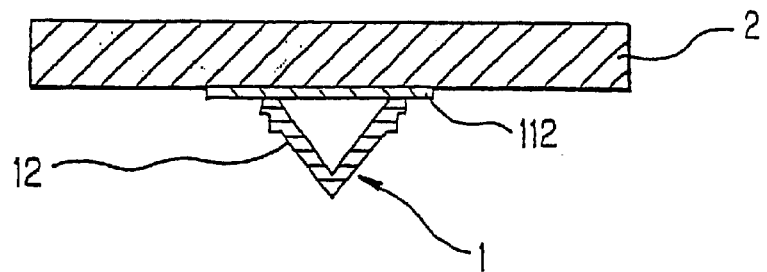

Specifically, as shown in FIG. 24, like the first example, the plated film 106 is transferred onto the electrode 112, thereby the bump structure 1 is formed as shown in FIG. 25.

Figure 26:
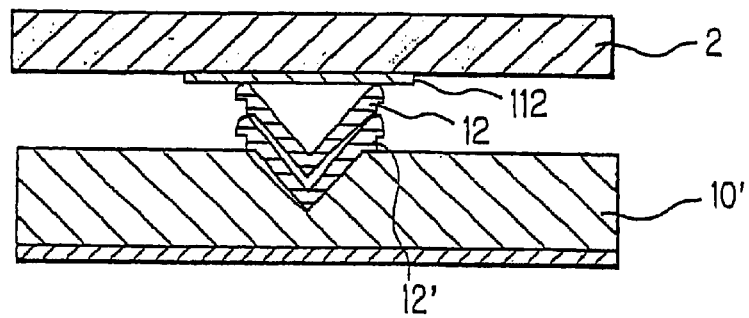

Next, like the fourth example, using the other molding plate 10' for forming the bump-forming member, plated film 106' of rhodium, nickel and solder plating is formed. Then, as shown in FIG. 26, the bump structure 1 in FIG. 25 is overlapped and bonded to the plated film 106' while heating at 250° C.

By thus overlapping the bump structure, the aspect ratio of bump can be increased.

Thus, in this example, the bump structure 1 of 40 $\mu$m wide and 60 $\mu$m high is obtained at 60 $\mu$m pitch.

A sixth example of the bump structure 1 according to the invention will be explained below.

Figure 27:
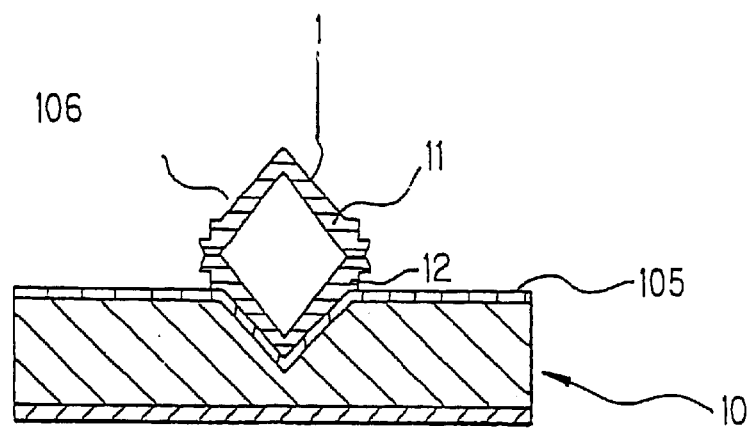
FIGS. 27 to 29 are cross sectional views showing an example of a method of making a still further bump structure according to the invention.

In this example, as shown in FIG. 27, like the second example, two bump-forming members 11, 12 are formed by using two molding plates 10, 10' for forming the bump-forming member, and then the bump-forming member 11 on one molding plate 10 for forming the bump-forming member is transferred to the bump-forming member 12 on the other molding plate 10' for forming the bump-forming member.

Figure 28:
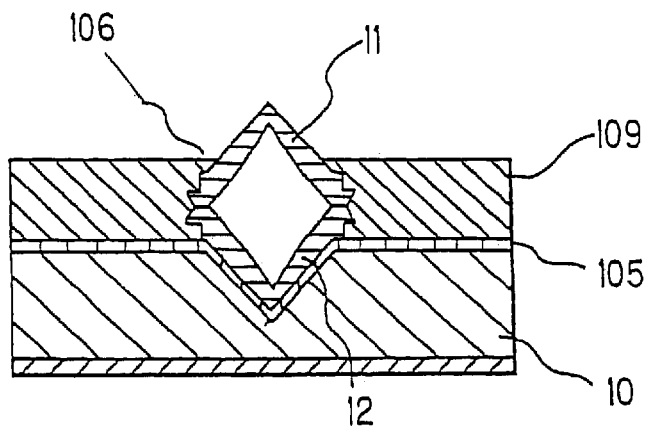

As shown in FIG. 28, varnish 109 of, e.g., photosensitive polyimide is coated on the surface of the bump-forming mold 10 where the bump-forming member 12 is left, patterned so that the tip of the bump-forming member 11 is exposed, hardened at 300° C. to make film.

Figure 29:
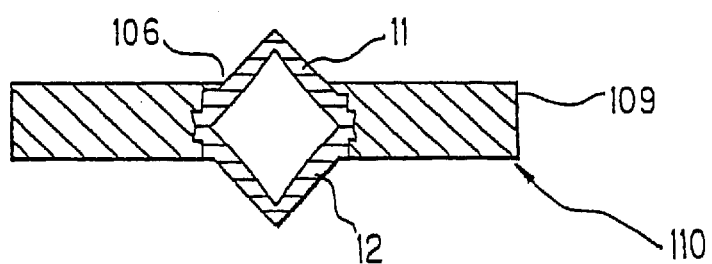

As shown in FIG. 29, this is soaked in a solution of 10% sulfuric acid and 10% hydrogen peroxide to dissolve the copper sputtered film 105, thereby anisotropic conductive film 110 with pointed ends on both sides is formed.

The bump structure 1 of this example has a high ability to contact penetrating through the surface of electrode to be connected even if it is oxidized, because the both ends are pointed.

In the example disclosed in Japanese patent application laid-open No. 7-167912, connection failure occurs when some pollution such as oxide film and organic film exists on an electrode to be connected, because its tip part is rounded.

Namely, in this example, by burying at least a part of the bump structure 1 with a predetermined synthetic resin material etc., the anisotropic conductive film where the bump structure 1 is fixed on the plane is obtained.

To compare the effect of the bump structure 1 of the invention with that of the conventional example, a simulative experiment is conducted using a wiring board polluted by 0.5 μm resist thin film.

With a sample in Japanese patent application laid-open No. 7-167912, the electrical connection was not obtained even when pressing at 20 g per bump. However, with a sample in this example, the electrical connection is obtained if only pressing 0.5 g per bump. Thus, the bump structure 1 of the invention has a high ability to penetrate through the pollution because the tip part is pointed.

Figure 30:
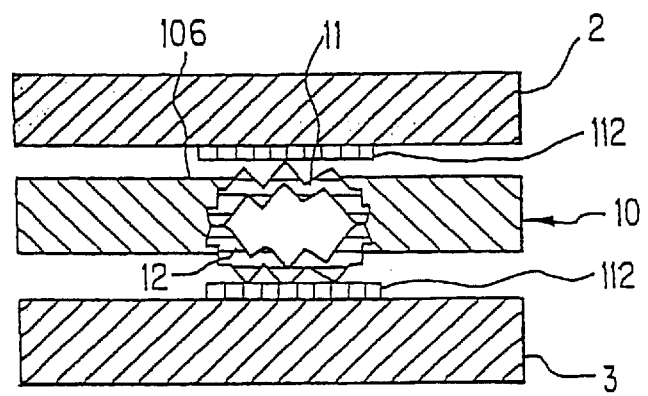
FIG. 30 is a cross sectional view showing the connection of a bump structure in FIG. 29 to substrates

FIG. 30 shows the case that the anisotropic conductive film 110 of the invention is sandwiched by two wiring boards 2, 3 and pressed at 100 g per bump structure. Thus, even if the an excessive pressure is applied after contacting, it does not apply an excessive stress to the electrodes 112, 112' of the wiring boards 2, 3 because the plated film 106 is deformed as shown in FIG. 30.

A seventh example of the bump structure 1 according to the invention will be explained below.

Figure 31:
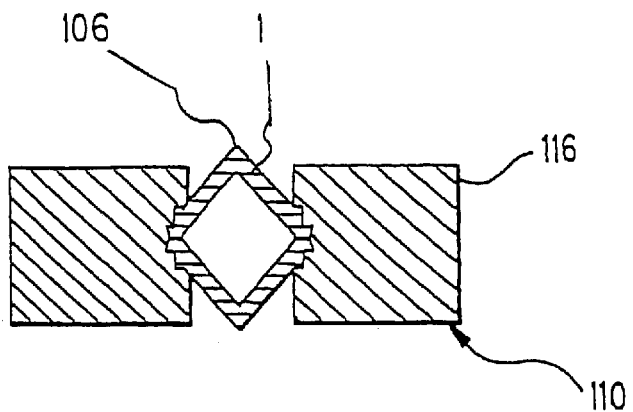
FIG. 31 is a cross sectional view showing an example of a method of making a still yet further bump structure according to the invention.

In this example, like the sixth example, anisotropic conductive film is formed as shown in FIG. 31, but cardo resin 116 is used in place of polyimide.

Figure 32:
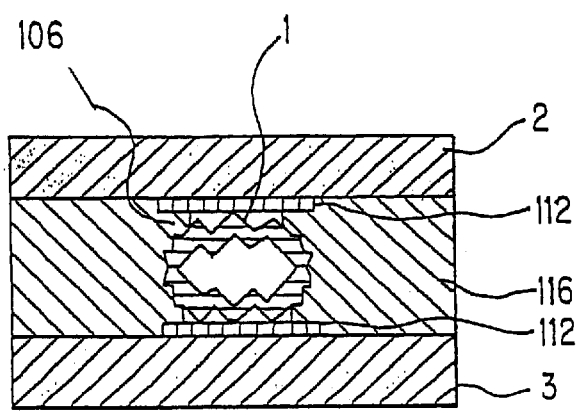
FIG. 32 is a cross sectional view showing the connection of a bump structure in FIG. 31 to substrates

The cardo resin 116 is bonded to wiring boards 2, 3 while heating at 350° C. and pressing at 5 kg/cm². As shown in FIG. 32, the two wiring boards 2, 3 are aligned, heated and pressed sandwiching the anisotropic conductive film 110 therebetween to get the electrical and mechanical connection.

An eighth example of the bump structure 1 according to the invention will be explained below.

Figure 33:
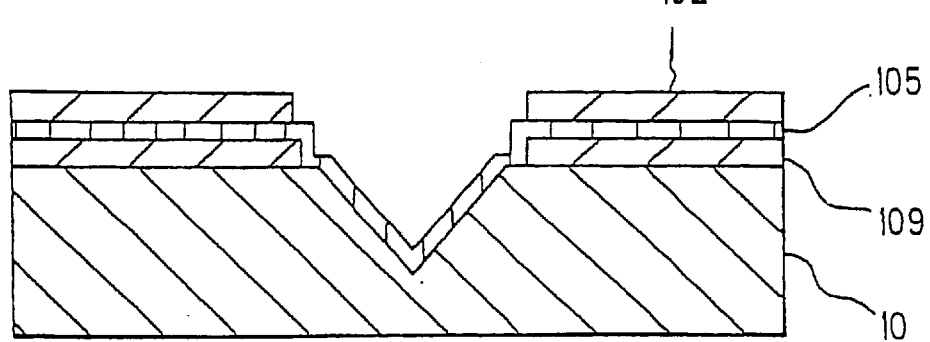
FIG. 33 is a cross sectional view showing an example of a method of making another bump structure according to the invention.

In this example, the bump structure 1 is made like the first example. As shown in FIG. 33, polyimide pattern 109 is formed on the molding plate 10 for forming the bump-forming member, then patterning and plating in like manner, the height of bump is thereby increased by 10 μm.

Namely, in this example, by adjusting the film thickness of polyimide 109, the aspect ratio of bump structure can be controlled.

An ninth example of the bump structure 1 according to the invention will be explained below.

Figure 34:
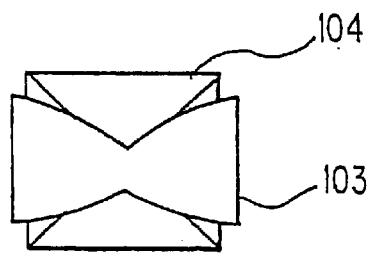
FIG. 34 is a top view showing an etch pit and an aperture of photoresist according to the invention.

In this example, when copper sputtered film and photoresist are formed on the molding plate 10 for forming the bump-forming member like the first example, an aperture 103 is formed by a pattern in FIG. 34.

Thus, in this example, a relatively large opening is formed on the sides of the bump-forming member.

Namely, in forming the plated film 106, resist is, in advance, disposed as shown so as not to form plated film 106 at that part. On the sides of the bump-forming member, the relatively large opening can be formed as shown in FIG. 7E. As a result, the bump structure 1 that is so structured as shown in FIGS. 4A and 4B can also have a reduced strength, thereby bringing out a flexible characteristic to pressing or lateral biasing. Therefore, the absorption of strain or the absorption of pressing external force and further the connection between unconformable electrodes can be enhanced.

Namely, when the bump structure 1 in this example is pressed against IC electrode, the concentration of stress is difficult to happen, compared with the first example. Even when IC is pressed against a substrate at an excessive pressure, electrodes on IC or substrate are not broken.

Advantages of the Invention

In the bump structure of the invention as composed above, the first advantage is that bumps used to connect IC and wiring board can be made inexpensively. This is because bumps formed by plated film are transferred and are in one lump mass-produced.

The second advantage is that transferring of bumps used to connect IC and wiring board can be conducted at a high yield ratio. This is because the release from bump-forming mold can be promoted by providing a notch when plated film is formed.

The third advantage is that bumps with uniform height and pointed tip can be produced at a narrow pitch. This is because plated film formed by using fine-processed etch pit is transferred.

The fourth advantage is that bumps with high aspect ratio can be produced at a narrow pitch. This is because the height of bump can be doubled by bonding two bumps formed by using separate substrates. Also, alternatively, another bump can be overlapped to a transferred bump.

The fifth advantage is that bumps with flexibility can be produced. This is because it has a hollow structure formed by bonding bumps and it can transform by notches formed at its center part.

Further, the number, density and shape of bump structure 1 formed on a substrate can be arbitrarily adjusted to match the arrangement state or pattern of electrodes or terminals on an electronic part to be connected therewith.

Also, in this invention, the bump-forming member is made, for example, by forming sputtered film on the etch pit of silicon substrate, patterning resist thereon, plating. In this process, part of resist pattern is formed to cover, e.g., the corner of the etch pit and the aperture of resist is controlled to be smaller than the etch pit when plating is conducted. Thus, after removing the resist and etching the sputtered film, the bump-forming member can be easily transferred to another substrate by thermal compressive bonding or soldering.

Namely, in this invention, a precise and point-contact terminal with pointed tip can be formed by using the silicon etch pit as a mold. Further, by sputtering copper on the silicon, the bump-forming member 10 can be easily released in the later process.

Also, in this invention, the photoresist pattern for forming plated film to compose the bump-forming member 10 is so made that the photoresist 102 also covers the corner 31 of the etch pit 104, as shown in FIGS. 11A and 11B. Therefore, when the point-contact terminal 10 is transferred in the later process, it can be easily released by etching copper.

Further, in this invention, when transferring the point-contact terminal, it is separated with the sputtered film. Also, the sputtered film left on the molding plate for forming bump-forming member is dissolved. Thereby, the sputtered film can be removed. Therefore, even when the mold is used repeatedly, pollution or injure does not occur in forming the bump-forming member.

Further, in this invention, the point-contact terminal can be made inexpensively because the silicon wafer with etch pit 104 can be used repeatedly.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a bump structure, comprising the steps of:
   preparing at least two molding plates with a concave mold to mold a bump-forming member;
   forming a conductive thin film so as to form a predetermined cavity in the concave mold of each of the molding plates;
   bonding bump-forming members made of said conductive thin film formed on each of the molding plates while keeping the outermost ends of said bump-forming members opposite to each other; and
   separating said bump-forming member made of said conductive thin film formed on one molding plate from said one molding plate, and transferring said separated bump-forming member to the bump-forming member formed on another molding plate.

2. A method for making a bump structure, according to claim 1, further comprising the steps of:
   connecting said bump-forming member formed on said another molding plate to a predetermined electrode on a substrate prepared; and
   separating said bump-forming member formed on said another molding plate from said another molding plate.

3. A method for making a bump structure, according to claim 2, wherein:
   said at least two bump-forming members to be bonded mutually are provided with at least one notch near the outermost end of each of said members.

4. A method for making a bump structure, according to claim 3, wherein:
   said at least one notch is provided with different shapes between said bump-forming members.

5. A method for making a bump structure, according to claim 1, wherein:
   said at least two bump-forming members to be bonded mutually are provided with at least one notch near the outermost end of each of said members.

6. A method for making a bump structure, according to claim 5, wherein:
   said at least one notch is provided with different shapes between said bump-forming members.

7. A method for making a bump structure, comprising the steps of:
   preparing at least two molding plates with a concave mold to mold a bump-forming member;
   forming a conductive thin film so as to form a predetermined cavity in the concave mold of each of the molding plates;
   bonding bump-forming members made of said conductive thin film formed on each of the molding plates while superposing said bump-forming members in a same direction; and
   separating said bump-forming member made of said conductive thin film formed on one molding plate from said one molding plate, and transferring said separated bump-forming member to the bump-forming member formed on another molding plate.

8. A method for making a bump structure, according to claim 7, further comprising the steps of:
   covering at least one part of a plurality of said bump-forming members formed on said another molding plate with an insulating material; and
   separating said plurality of said bump-forming members from said another molding plate.

9. A method for making a bump structure, comprising the steps of:
   providing a molding plate having a concave mold for a hollow bump structure;
   forming a photoresist layer on the molding plate;
   depositing a conductive film in the concave mold and above a peripheral portion of the photoresist layer around the concave mold so that the conductive film forms the hollow bump structure having an open mouth above the photoresist layer;
   removing the photoresist layer so that the open mouth of the hollow bump structure extends above the molding plate;
   joining the open mouth of the hollow bump structure to a substrate; and
   removing the molding plate to leave the hollow bump structure on the substrate.

10. The method of claim 9, wherein the step of forming the photoresist layer includes forming the photoresist layer on an interior part of the concave mold so that an exterior of the hollow bump structure is indented at the interior part.

11. The method of claim 9, wherein the open mouth of the hollow bump structure extends radially beyond a periphery of the concave mold after the photoresist layer is removed.

12. The method of claim 9, wherein the step of depositing the conductive film comprises the steps of depositing at least two different materials with different electrical characteristics.

* * * * *